(12) United States Patent
Chan

(10) Patent No.: US 8,617,983 B2
(45) Date of Patent: Dec. 31, 2013

(54) LOCAL INTERCONNECT HAVING INCREASED MISALIGNMENT TOLERANCE

(75) Inventor: Simon S. Chan, Saratoga, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/608,698

(22) Filed: Sep. 10, 2012

(65) Prior Publication Data

US 2013/0005138 A1 Jan. 3, 2013

Related U.S. Application Data

(63) Continuation of application No. 12/970,675, filed on Dec. 16, 2010, now Pat. No. 8,283,249, which is a continuation of application No. 11/616,544, filed on Dec. 27, 2006, now Pat. No. 7,879,718.

(51) Int. Cl.
*H01L 21/4763* (2006.01)

(52) U.S. Cl.
USPC .......................................... 438/638; 438/261

(58) Field of Classification Search
USPC .......................... 438/261, 618, 630, 638, 639
See application file for complete search history.

(56) References Cited

U.S. PATENT DOCUMENTS

| | | | |
|---|---|---|---|
| 5,972,748 A | 10/1999 | Itoh et al. | |
| 6,579,778 B1 | 6/2003 | Tripsas et al. | |
| 6,720,612 B2 | 4/2004 | Takeuchi et al. | |
| 6,727,195 B2 | 4/2004 | Templeton et al. | |
| 6,815,292 B1 | 11/2004 | Fang et al. | |
| 7,166,889 B2 | 1/2007 | Tsunoda et al. | |
| 7,879,718 B2 | 2/2011 | Chan | |
| 2003/0073296 A1 | 4/2003 | Noble | |
| 2004/0012051 A1* | 1/2004 | Matsuda et al. | 257/330 |
| 2005/0258543 A1 | 11/2005 | Yaegashi | |
| 2006/0038218 A1 | 2/2006 | Yaegashi et al. | |
| 2006/0081915 A1 | 4/2006 | Ogura et al. | |
| 2006/0166384 A1 | 7/2006 | Tatsumi | |
| 2007/0004143 A1 | 1/2007 | Saito et al. | |
| 2007/0012981 A1 | 1/2007 | Yaegashi | |
| 2007/0012991 A1 | 1/2007 | Yaegashi | |
| 2008/0070362 A1 | 3/2008 | Yaegashi et al. | |
| 2008/0073694 A1 | 3/2008 | Willer et al. | |
| 2008/0074927 A1 | 3/2008 | Hofmann et al. | |
| 2008/0153228 A1 | 6/2008 | Cheng et al. | |
| 2008/0153298 A1 | 6/2008 | Hui et al. | |
| 2011/0084330 A1 | 4/2011 | Chan | |
| 2011/0129976 A1 | 6/2011 | Chan | |

* cited by examiner

*Primary Examiner* — Jarrett Stark
*Assistant Examiner* — John M Parker
(74) *Attorney, Agent, or Firm* — Harrity & Harrity, LLP

(57) ABSTRACT

A method is provided for forming an interconnect in a semiconductor memory device. The method includes forming a pair of source select transistors on a substrate. A source region is formed in the substrate between the pair of source select transistors. A first inter-layer dielectric is formed between the pair of source select transistors. A mask layer is deposited over the pair of source select transistors and the inter-layer dielectric, where the mask layer defines a local interconnect area between the pair of source select transistors having a width less than a distance between the pair of source select transistors. The semiconductor memory device is etched to remove a portion of the first inter-layer dielectric in the local interconnect area, thereby exposing the source region. A metal contact is formed in the local interconnect area.

20 Claims, 7 Drawing Sheets

US 8,617,983 B2

LOCAL INTERCONNECT HAVING INCREASED MISALIGNMENT TOLERANCE

RELATED APPLICATIONS

This application is a continuation of U.S. patent application Ser. No. 12/970,675, filed Dec. 16, 2010, which is a continuation of U.S. patent application Ser. No. 11/616,544, filed Dec. 27, 2006 (now U.S. Pat. No. 7,879,718), the disclosures of which are incorporated herein by reference.

TECHNICAL FIELD

Implementations consistent with the principles of the invention relate generally to semiconductor devices and methods of manufacturing semiconductor devices. The invention has particular applicability to non-volatile memory devices.

BACKGROUND ART

The escalating demands for high density and performance associated with non-volatile memory devices require small design features, high reliability and increased manufacturing throughput. The reduction of design features, however, challenges the limitations of conventional methodology. For example, the reduction of design features makes it difficult for the memory device to meet its expected data retention requirement.

One type of conventional electrically erasable programmable read only memory (EEPROM) device includes a silicon substrate with an oxide-nitride-oxide (ONO) stack formed on the substrate. A silicon control gate is formed over the ONO stack. This type of memory device is often referred to as a SONOS (silicon-oxide-nitride-oxide-silicon) type memory device. In a SONOS device, the nitride layer acts as the charge storage layer. In an alternative EEPROM design, the charge storage layer may include a polysilicon floating gate. In a more specific implementation, EEPROM memory devices of these types may be implemented as an array of memory cells configured in a NAND arrangement.

DISCLOSURE OF THE INVENTION

In an implementation consistent with the principles of the invention, a method is provided for forming an interconnect in a semiconductor memory device. The method includes forming a pair of source select transistors on a substrate. A source region is formed in the substrate between the pair of source select transistors. A first inter-layer dielectric is formed between the pair of source select transistors. A mask layer is deposited over the pair of source select transistors and the first inter-layer dielectric, where the mask layer defines a local interconnect area between the pair of source select transistors having a width less than a distance between the pair of source select transistors. The semiconductor memory device is etched to remove a portion of the first inter-layer dielectric in the local interconnect area, thereby exposing the source region. A metal contact is formed in the local interconnect area.

In another implementation consistent with the principles of the invention, a semiconductor device is provided. The semiconductor device includes a substrate having a source region formed in an active region. A pair of source select transistors is formed above the substrate on opposite sides of the source region. A first inter-layer dielectric is formed above the substrate in between the pair of source select transistors. A local interconnect comprising a metal is formed adjacent the first inter-layer dielectric, where the local interconnect has a width narrower than a distance between the pair of source select transistors.

In yet another implementation consistent with the principles of the invention, a method of fabricating a semiconductor device having a pair of select transistors formed over a substrate is provided. The method includes: forming a source region between the pair of select transistors, the source region have a silicide region formed in an upper surface thereof; forming a liner oxide layer over the pair of select transistors and the source region; forming spacers adjacent the interior sidewalls of the pair of select transistors over the liner oxide layer; depositing a inter-layer dielectric between the spacers; etching the inter-layer dielectric and the liner oxide layer to form a local interconnect area have a width less than a distance between the pair of select transistors; and forming a metal contact within the local interconnect area.

BRIEF DESCRIPTION OF THE DRAWINGS

The accompanying drawings, which are incorporated in and constitute a part of this specification, illustrate an embodiment of the invention and, together with the description, explain the invention. In the drawings.

BEST MODE FOR CARRYING OUT THE INVENTION

The following detailed description of implementations consistent with the principles of the invention refers to the accompanying drawings. The same reference numbers in different drawings may identify the same or similar elements. Also, the following detailed description does not limit the invention. Instead, the scope of the invention is defined by the appended claims and their equivalents.

Figure 1:
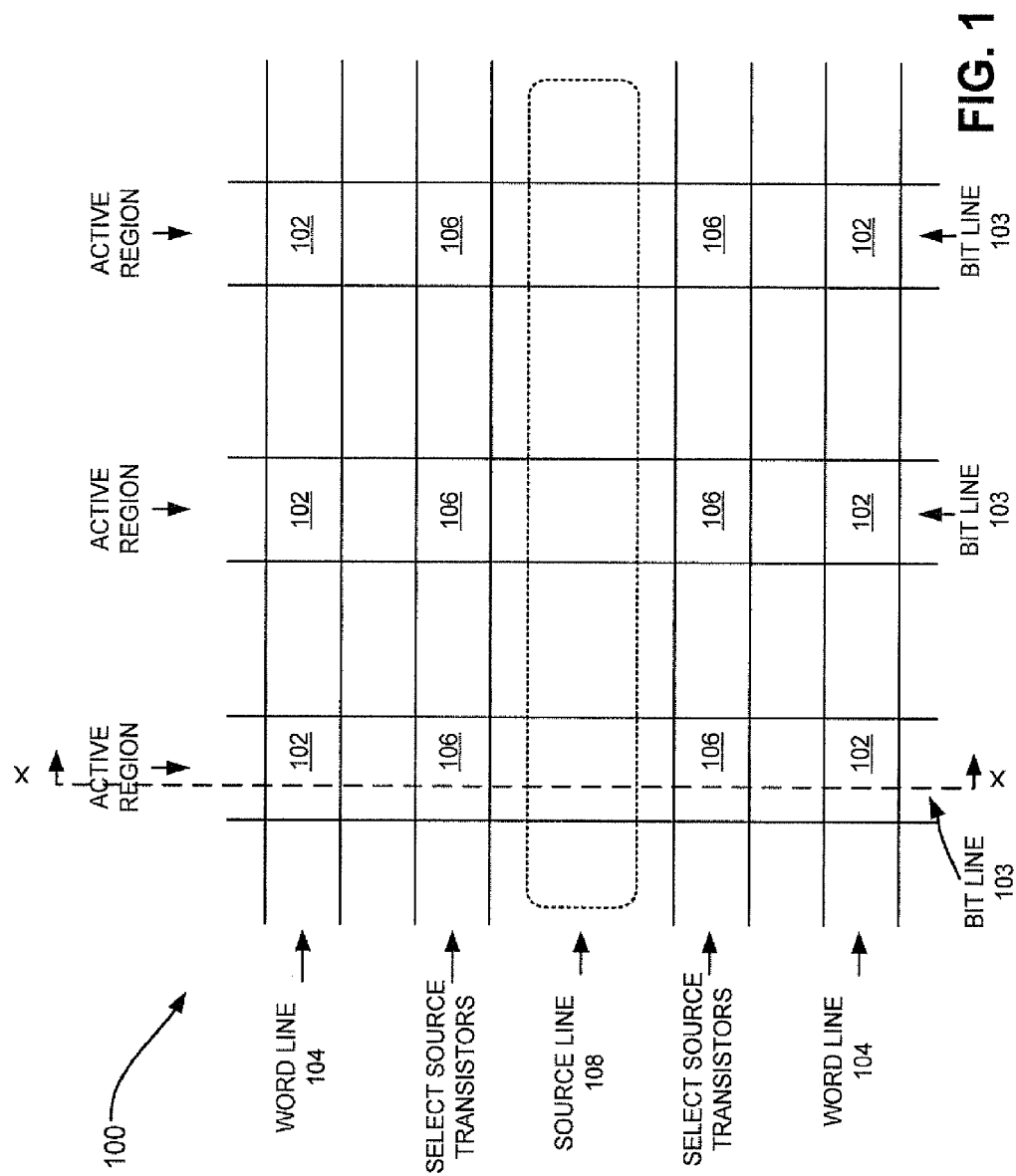
FIG. 1 illustrates an exemplary configuration of a semiconductor device in an implementation consistent with the principles of the invention.

FIG. 1 illustrates an exemplary configuration of a semiconductor device 100, such as a flash EEPROM semiconductor device. Semiconductor device 100 may include a plurality of memory cells 102 arranged in a rectangular matrix or array of rows and columns and include a plurality of bit lines (BL) associated with each column, a plurality of word lines (WL) 104 associated with each row and a plurality of select lines (SL) coupled to select source transistors 106.

As illustrated, semiconductor device 100 may include rows of memory cells 102 along word lines 104 formed in the active regions of semiconductor device 100. Semiconductor device 100 may also include rows of select source transistors 106 in the active regions. Semiconductor device 100 may also include a source line 108 (shown as via the dotted lines in FIG. 1) as is known in the art. In one implementation, each cell 102 includes a source and drain formed in a semiconductor substrate, a tunnel oxide layer, a charge storage layer, and a control gate separated from the charge storage layer by an inter-gate dielectric.

Additional details regarding the formation of device 100 will be described below in relation to FIGS. 2-9. As can be appreciated, the cells 102 of memory device 100 differ from conventional FETs in that they include the charge storage layer and tunnel oxide layer disposed between the control gate and the semiconductor substrate in which the source and drain are formed.

EXEMPLARY PROCESSING

Figure 2A:
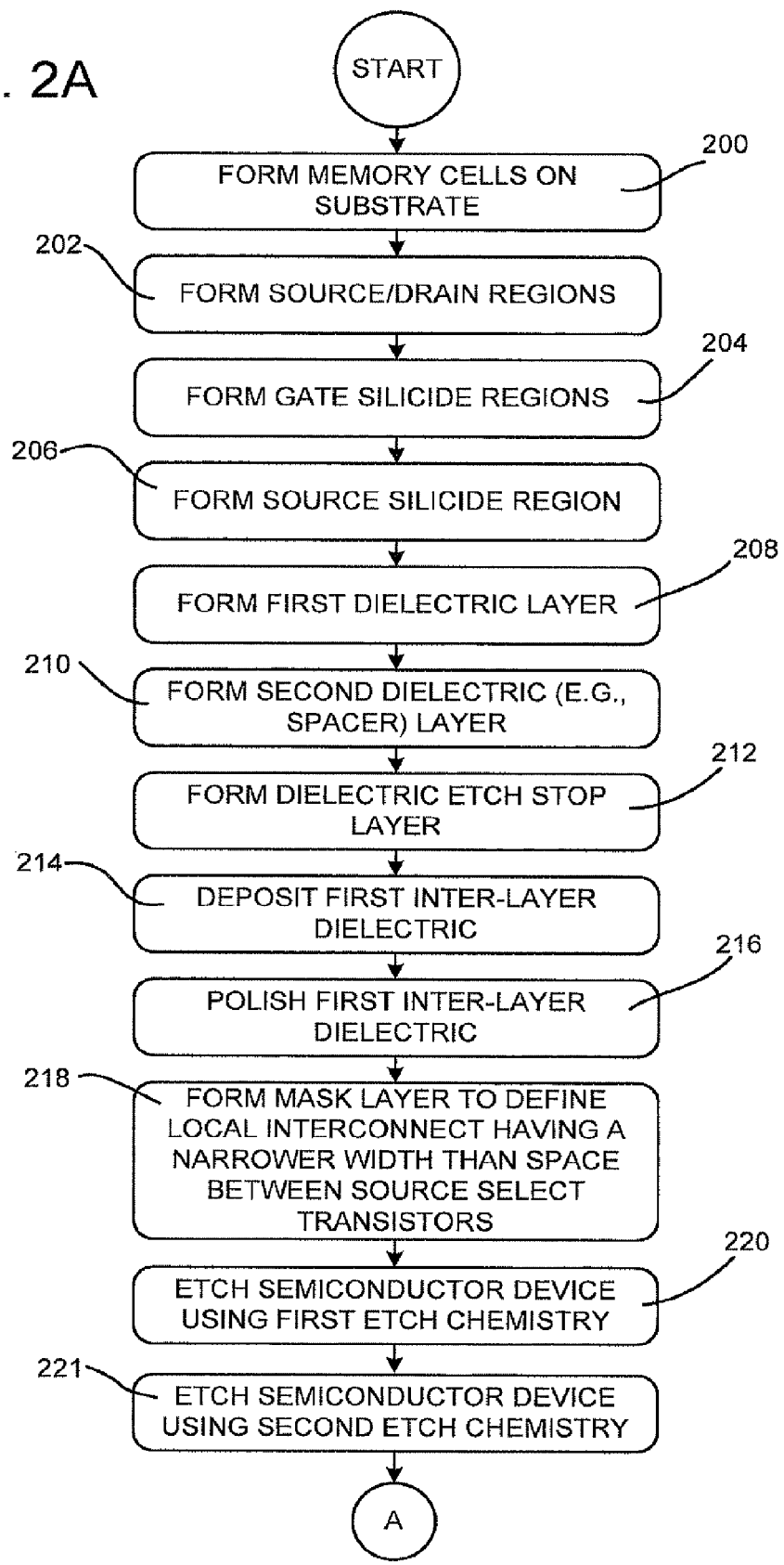
FIGS. 2A-2B illustrate an exemplary process for forming a semiconductor memory device in an implementation consistent with the principles of the invention.
Figure 2B:
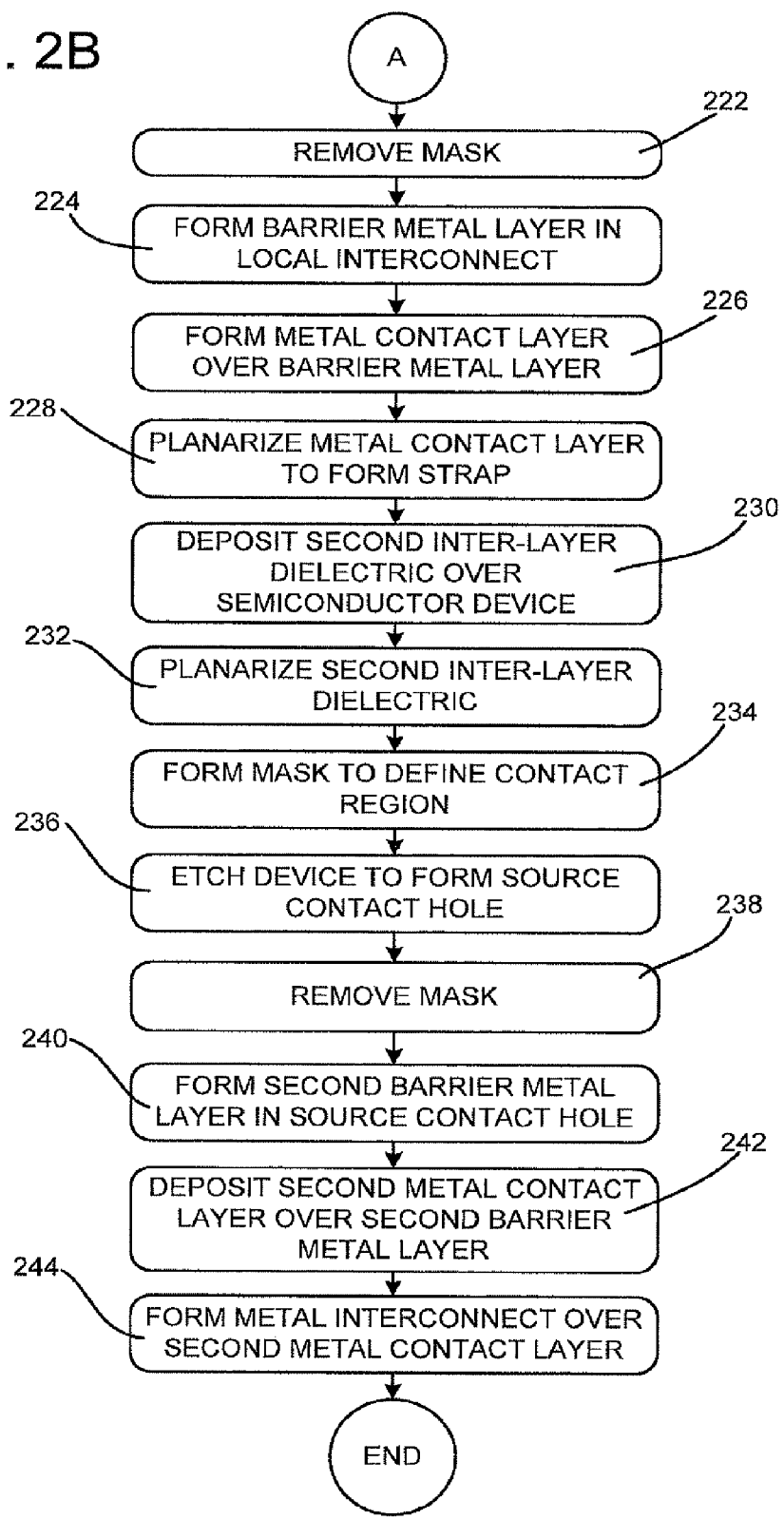

FIGS. 2A-2B illustrates an exemplary process for forming a semiconductor memory device in an implementation consistent with the principles of the invention. In one implementation, the semiconductor memory device includes an array of memory cells and transistors in a flash memory device, such as that illustrated in FIG. 1. FIGS. 3-9 illustrate exemplary views of a semiconductor memory device taken along line X-X' in FIG. 1 fabricated in accordance with principles of the invention.

Figure 3:
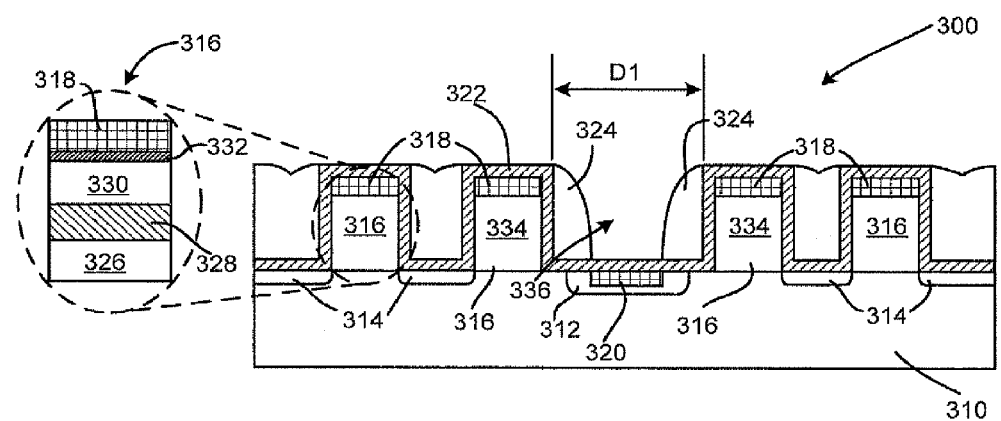
FIGS. 3-9 illustrate exemplary views of a semiconductor memory device fabricated according to the processing described in FIGS. 2A-2B.

With reference to FIGS. 2A and 3, processing may begin with a semiconductor device 300 having a defined structure. As shown in FIG. 3, semiconductor device 300 may initially include a substrate layer 310 having a source region 312 and merged source/drain regions 314 formed therein, a number of memory cells 316 formed over the substrate layer 310, gate silicide regions 318 formed in memory cells 316, a source silicide region 320 formed in source region 312, a first dielectric layer 322 formed over the substrate 310 and memory cells 316, and a second dielectric layer 324 (e.g., spacers) formed over the first dielectric layer 322. Only two memory cells 316, two source select transistors 334, one source region 312, and four merged source/drain regions 314 are shown in FIG. 3 for simplicity. It should be understood that semiconductor device 300 may include a larger number of memory cells 316, source select transistors 334, source regions 312 and merged source/drain regions 314.

In an exemplary embodiment, layer 310 may be a crystalline substrate of semiconductor device 300 and may include silicon, germanium, silicon-germanium or other semiconducting materials. In alternative implementations, layer 310 may be a conductive layer formed a number of layers above the surface of a substrate in semiconductor device 300. As is known in the art, substrate layer 310 may include conventional features, such as P-well implants, etc., the descriptions of which are not provided herein to not unduly obscure the thrust of the present invention.

Memory cells 316 may be formed in a conventional manner, as illustrated in FIG. 3 (act 200). In one implementation consistent with principles of the invention, memory cells 316 may include SONOS-type memory cells, where each memory cell 316 includes a tunnel oxide layer 326, a nitride charge storage layer 328, an inter-gate dielectric layer 330, and a polysilicon control gate layer 332. In alternative implementations, memory cells 316 may be floating gate memory cells, with each cell having a silicon control gate electrode 332, an ONO layer 330, a polysilicon floating gate electrode 328 and a tunnel oxide layer 326 formed on substrate 310. In an even more specific implementation, charge storage layer 328 may act as a multi-bit or dual bit charge storage layer for storing multiple bits in each memory cell 316.

Source select transistor 334 may define a source line interconnect area 336 for semiconductor device 300. A distance between source select transistors 334 may range from about 1500 Å to about 10,000 Å. Additional details regarding subsequent formation of source line interconnect will be set forth in additional detail below.

Source region 312 and merged source/drain regions 314 may be formed in substrate 310 in a conventional manner (act 202). For example, n-type or p-type impurities may be implanted in substrate 310 to form these regions. The particular implantation dosages and energy used to form source region 312 and merged source/drain regions 314 may be selected based on the particular end device requirements. One of ordinary skill in the art would be able to optimize the source/drain implantation process based on the particular circuit requirements. It should also be understood that source region 312 and merged source/drain regions 314 may alternatively be formed at other points in the fabrication process of semiconductor device 300. For example, sidewall spacers (e.g., second dielectric layer 324) may be formed prior to the source/drain ion implantation to control the location of the source/drain junctions based on the particular circuit requirements.

Gate silicide regions 318 may be formed in polysilicon control gate layer 332 of memory cells 316 in a conventional manner (act 204). In one implementation consistent with principles of the invention, a metal, such as tungsten, cobalt, titanium, tantalum or molybdenum, may be deposited on the upper surfaces of polysilicon control gates 332 to a thickness ranging from about 50 Å to about 500 Å. A thermal annealing may then be performed to create a metal-silicide structure 318. In one implementation, the thermal anneal is performed at a temperature ranging from about 300° C. to about 1000° C.

Source silicide region 320 may be formed on at least a portion of the top surface of source region 312, as illustrated in FIG. 1 (act 206). For example, a metal, such as tungsten, cobalt, titanium, tantalum nickel or molybdenum, may be deposited on the upper surfaces of source region 312 to a thickness ranging from about 50 Å to about 500 Å. A thermal annealing may then be performed to create a metal-silicide structure 320. In one implementation, the thermal anneal is performed at a temperature ranging from about 300° C. to about 1000° C.

First dielectric layer 322 may be formed over substrate layer 310 and memory cells 316 in a conventional manner (act 208). In one implementation consistent with principles of the invention, first dielectric layer 322 may include a dielectric material, such as silicon dioxide ($SiO_2$) and may function as a liner oxide in semiconductor device 300. In one exemplary embodiment, first dielectric layer 322 may be a silicon dioxide layer having a thickness ranging from about 50 Å to about 500 Å. In one implementation consistent with principles of the invention, the distance between respective interior surfaces of first dielectric layer 322 on interior sidewalls of source select transistors 334, rather than the distance between cells 334 is defined as D1.

Second dielectric layer 324 may be formed in a conventional manner over first dielectric layer 322, as shown in FIG. 1 (act 210). Second dielectric layer may be formed of a dielectric material, such as silicon nitride or "nitride" (e.g., $Si_3N_4$) and may function as a spacer layer in semiconductor device 300. In one implementation, second dielectric layer 324 is deposited on semiconductor device 300 by low pressure chemical vapor deposition (LPCVD). The deposited layer 324 may then be anisotropically etched to form final spacer layer 324.

Figure 4:
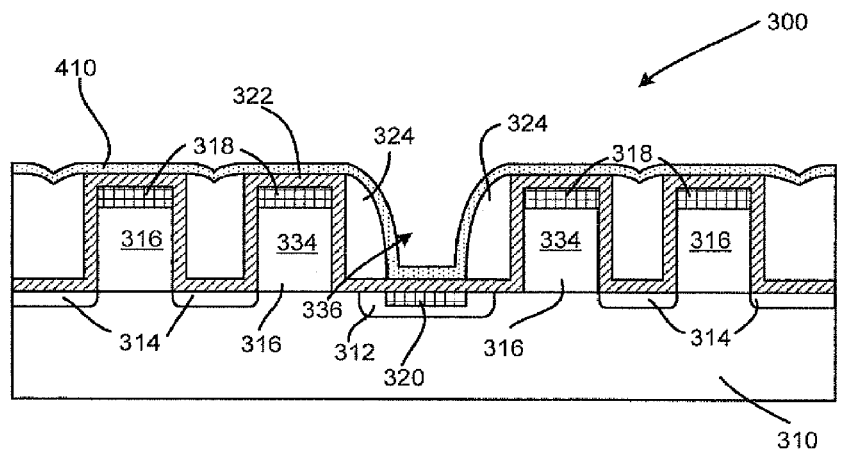

Following spacer formation, a dielectric etch stop layer 410 may be formed in a conventional manner over semiconductor device 300, as illustrated in FIG. 4 (act 212). In one implementation consistent with principles of the invention, dielectric etch stop layer 410 may include a dielectric material, such as a silicon nitride (e.g., $Si_3N_4$) or silicon oxynitride (SiON) and may function as an etch stop layer during subsequent processing of semiconductor device 300. In one exemplary embodiment, dielectric etch stop layer 410 is a silicon nitride layer having a thickness ranging from about 100 Å to about 1000 Å.

Figure 5:
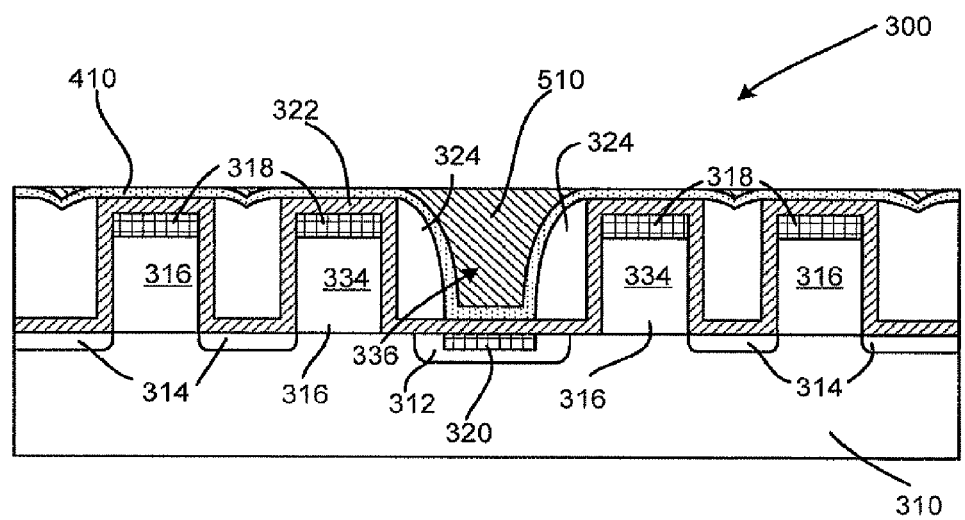

A first inter-layer dielectric layer (referred to herein as "ILD0") 510 may be deposited over semiconductor device 300 in a conventional manner to fill the space between all devices fabricated on substrate 310 (act 214). In one implementation consistent with principles of the invention, ILD0 510 may include a dielectric material, such as silicon dioxide ($SiO_2$). ILD0 510 may then be selectively polished back using, e.g., a selective slurry such as a ceria-based slurry to expose an upper surface of etch stop layer 410, as illustrated in FIG. 5 (act 216). It should be understood that any suitable chemical-mechanical polishing (CMP) techniques may be used to polish ILD0 510.

Figure 6:
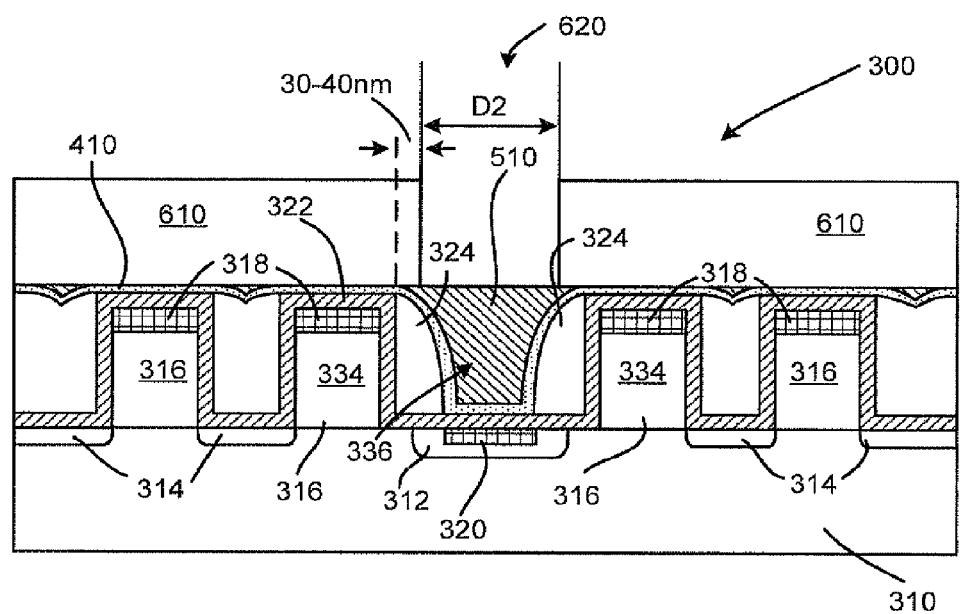

Following polishing of ILD0 510, a mask layer 610 may be patterned and formed over semiconductor device 300, as shown in FIG. 6 (act 218). Mask layer 610 may be conventionally formed by patterning a photoresist layer using ultraviolet light to define areas to be protected during subsequent etching steps. In the current implementation, mask layer 610 is patterned to define a local interconnect opening 620 formed above source region 312 in substrate layer 310.

Consistent with principles of the invention, mask layer 610 may be specifically patterned to define a local interconnect opening 620 having a width D2 that is slightly smaller than the width D1, between interior surfaces of first dielectric layer 322 on the interior sidewalls of source select cells 334, as described above. In one implementation consistent with principles of the invention, D2 is approximately 40 to 60 nm less than the width D1. More specifically, each interior edge of mask layer 610 may be approximately 20 to 30 nm offset from the corresponding interior edge of first dielectric layer 322, in order to provide a suitable misalignment budget for ensuring that a subsequently formed interconnect will be formed between source select transistors 334 while simultaneously providing fully access to source silicide region 320 in substrate 310.

Figure 7:
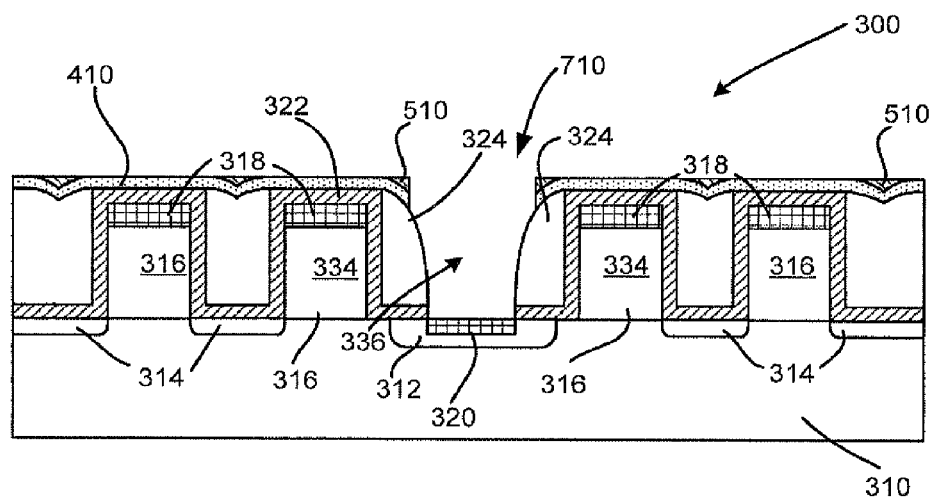

Following formation of mask layer 610, semiconductor device 300 may be etched to remove ILD0 510, stop layer 410, and first dielectric layer 322 in the region defined by mask layer 610 and nitride spacers 324, thereby forming local interconnect opening 710, as illustrated in FIG. 7 (act 220). In one implementation consistent with principles of the invention, semiconductor device 300 may be etched using a dry plasma etch that first selectively removes ILD0 510 without removing stop layer 410. The etch chemistry may then be changed to facilitate removal of dielectric etch stop layer 410 and liner oxide layer 322, without removing spacers 324 (act 221). As shown in FIG. 7, by maximizing the width of local interconnect opening 710 (D2) to the limits allowed by the misalignment budget, full contact of a subsequently formed contact material with the source silicide region 320 may be achieved. Mask layer 610 may then be removed in a conventional manner (act 222).

Figure 8:
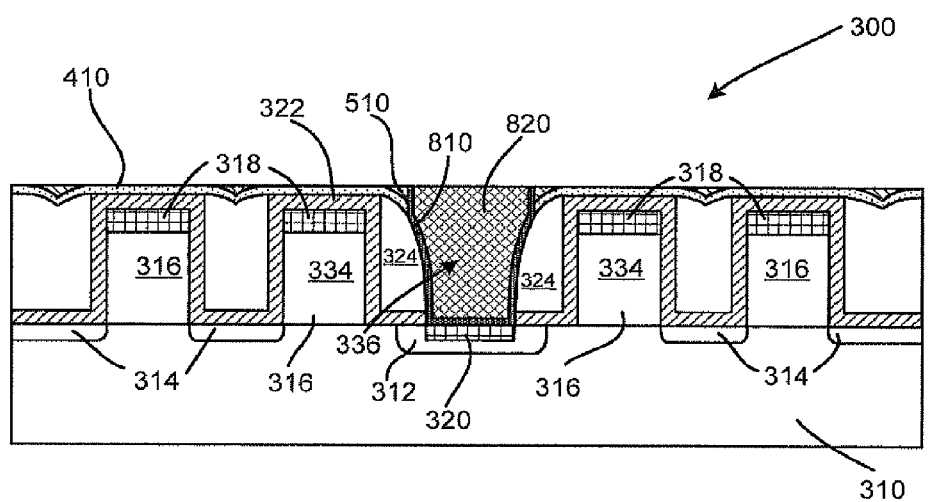

A barrier metal layer 810 may then be deposited within local interconnect opening 710 in a conventional manner, as illustrated in FIG. 8 (act 224). In one exemplary implementation, barrier metal layer 810 may be a titanium (Ti) followed by a titanium nitride (TiN) layer having a having a thickness ranging from about 50 Å to about 300 Å for both materials. Following deposition of barrier metal layer 810, a metal contact layer 820 may be deposited within interconnect 710 opening, as illustrated in FIG. 8 (act 226). In one exemplary implementation, metal contact layer 820 may be formed of tungsten, copper, or aluminum having a thickness ranging from about 1000 Å to about 10,000 Å.

Barrier metal layer 810 and metal contact layer 820 may be planarized to form a metal strap (e.g., a tungsten strap), as illustrated in FIG. 8 (act 228). In one implementation consistent with principles of the invention, layers 810 and 820 may be planarized using a conventional CMP process.

Figure 9:
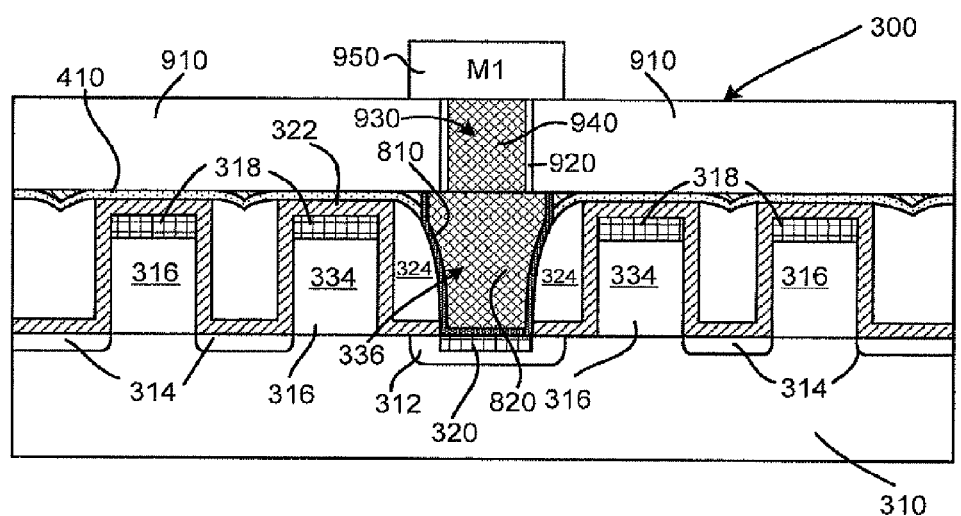

A second inter-layer dielectric layer (referred to herein as "ILD0.5") 910 may then be formed over semiconductor device 300, as illustrated in FIG. 9 (act 230). In one implementation consistent with principles of the invention, ILD0.5 may be an oxide material (e.g., $SiO_2$) having a thickness ranging from about ranging from about 1000 Å to about 10,000 Å. ILD0.5 910 may then be planarized using, e.g., a CMP process to facilitate formation of subsequent structures, such as interconnect lines (act 232). It should be understood that any suitable planarizing techniques may be used to planarize ILD0.5 910.

Following planarizing of ILD0.5 910, a mask layer (not shown) may be patterned and formed over semiconductor device 300, to define a contact region in ILD0.5 910 (act 234). ILD0.5 910 may then be etched to remove ILD0.5 910 in the region defined by the mask layer, thereby forming a source contact hole 920, as illustrated in FIG. 9 (act 236). In one implementation consistent with principles of the invention, ILD0.5 910 may be etched using a dry plasma etch that selectively removes ILD0.5 910. The mask layer may then be removed following completing of the etching of act 236 (act 238).

A second barrier metal layer 930 may then be deposited within source contact hole 920 in a conventional manner, as illustrated in FIG. 9 (act 240). In one exemplary implementation, second barrier metal layer 930 may be a titanium (Ti) followed by a titanium nitride (TiN) layer, each having a having a thickness ranging from about 50 Å to about 300 Å. Following deposition of second barrier metal layer 930, a second metal contact layer 940 may be deposited within source contact hole 920 (act 242). In one exemplary implementation, second metal contact layer 940 may be formed of tungsten, copper or aluminum and may have a thickness ranging from about 1000 Å to about 10,000 Å. Second barrier metal layer 930 and second metal contact layer 940 may be polished back to form a metallized contact. A metal interconnect (M1) 950 (e.g., tungsten, copper or aluminum) may then be formed on an upper surface of the planarized metal contact layer 940 in a conventional manner to establish an electrical connection to the metallized source line (act 246).

Additional ILDs and metal lines may be formed to complete the fabrication of semiconductor device 300 based on the particular circuit requirement. For example, additional ILD's and metal layers may be formed over metal interconnect 950. A top dielectric layer, also referred to as cap layer, may also be formed over a top most conductive line. The cap layer may act as a protective layer to prevent damage to conductive lines and other portions of semiconductor device 300 during subsequent processing. For example, cap layer may protect semiconductor device 300 against impurity contamination during subsequent cleaning processes that may be used to complete a working memory device.

CONCLUSION

The foregoing description of exemplary embodiments of the invention provides illustration and description, but is not intended to be exhaustive or to limit the invention to the precise form disclosed. Modifications and variations are possible in light of the above teachings or may be acquired from practice of the invention. For example, in the above descriptions, numerous specific details are set forth, such as specific materials, structures, chemicals, processes, etc., in order to provide a thorough understanding of the invention. However, implementations consistent with the invention can be practiced without resorting to the details specifically set forth herein. In other instances, well known processing structures have not been described in detail, in order not to unnecessarily obscure the thrust of the present invention. In practicing the invention, conventional deposition, photolithographic and etching techniques may be employed, and hence, the details of such techniques have not been set forth herein in detail.

While a series of acts has been described with regard to FIGS. 2A-2B, the order of the acts may be varied in other implementations consistent with the invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A method comprising:
   forming a first source select transistor on a first side of a source region of a semiconductor device;
   forming a second source select transistor on a second side of the source region,
   the second side being different from the first side; and
   forming a metal strap over the source region and between the first source select transistor and the second source select transistor,
   a first portion of the metal strap being wider than a second portion of the metal strap.

2. The method of claim 1, where forming the metal strap includes:
   depositing a barrier metal layer within an interconnect opening between the first source select transistor and the second source select transistor,
   depositing a metal contact layer within the interconnect opening, and planarizing the barrier metal layer and the metal contact layer to form the metal strap.

3. The method of claim 2,
   where the barrier metal layer includes titanium, and
   where the metal contact layer includes tungsten, copper, or aluminum.

4. The method of claim 1, where the metal strap includes a tungsten strap.

5. The method of claim 1, further comprising:
   forming a silicide region over an upper surface of the source region before forming the metal strap.

6. The method of claim 1, where forming the metal strap includes:
   forming spacers adjacent to interior sidewalls of the first source select transistor and the second source select transistor, and
   forming the metal strap between the spacers.

7. The method of claim 1, further comprising:
   forming an inter-layer dielectric over the semiconductor device after forming the metal strap.

8. The method of claim 1, further comprising:
   forming a liner oxide layer over the first source select transistor and the second source select transistor.

9. A method including:
   forming a first source select transistor on a first side of a source region of a semiconductor device;
   forming a second source select transistor on a second side of the source region; and
   forming a strap between the first source select transistor and the second source select transistor,
   a first portion of the strap being wider than a second portion of the strap.

10. The method claim 9, where forming the strap includes:
    depositing a metal layer within an interconnect opening between the first source select transistor and the second source select transistor, and
    planarizing the metal to form the strap.

11. The method claim 9, where forming the strap includes:
    forming spacers adjacent to interior sidewalls of the first source select transistor and the second source select transistor, and
    forming the strap between spacers.

12. The method of claim 9, further comprising:
    forming an inter-layer dielectric over the source region after forming the strap.

13. The method of claim 9, where the strap includes a tungsten strap.

14. A method comprising:
    forming a first source select transistor on a first side of a source region;
    forming a second source select transistor on a second side of the source region,
    the second side being different from the first side; and
    forming an interconnect area between the first source select transistor and the second source select transistor,
    a first portion of the interconnect area being wider than a second portion of the interconnect area.

15. The method of claim 14, further comprising:
    depositing a barrier metal layer in the interconnect area.

16. The method of claim 14, further comprising:
    forming a silicide region on an upper surface of the source region before forming the interconnect area.

17. The method of claim 14, further comprising:
    forming a liner oxide layer over the first source select transistor and the second source select transistor.

18. The method of claim 14, where forming the interconnect area includes:
    forming spacers adjacent to interior sidewalls of the first source select transistor and the second source select transistor, and
    forming the interconnect area between the spacers.

19. The method of claim 14, where a width of the interconnect area is between 40 nm and 60 nm less than a distance between the first source select transistor and the second source select transistor.

20. The method of claim 14, where forming the interconnect area includes:
    etching an inter-layer dielectric to form the interconnect area.

* * * * *